(12) United States Patent
Okino (10) Patent No.: US 6,680,481 B2
(45) Date of Patent: Jan. 20, 2004

(54) MARK-DETECTION METHODS AND CHARGED-PARTICLE-BEAM MICROLITHOGRAPHY METHODS AND APPARATUS COMPRISING SAME

(75) Inventor: Teruaki Okino, Kamakura (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/165,284

(22) Filed: Jun. 4, 2002

(65) Prior Publication Data
US 2003/0010933 A1 Jan. 16, 2003

(30) Foreign Application Priority Data
Jun. 5, 2001 (JP) .................................. 2001-169353

(51) Int. Cl.[7] .............................................. G01N 23/00
(52) U.S. Cl. .................................. 250/491.1; 250/492.2
(58) Field of Search ....................... 250/491.1, 492.1, 250/492.2, 491.21–491.24, 492.3; 430/30

(56) References Cited
U.S. PATENT DOCUMENTS 4,563,094 A * 1/1986 Yamada ...................... 356/401
6,277,531 B1 * 8/2001 Morita ......................... 430/30
6,277,532 B1 * 8/2001 Yahiro ......................... 430/30

* cited by examiner

Primary Examiner—John R. Lee
Assistant Examiner—Christopher M. Kalivoda
(74) Attorney, Agent, or Firm—Klarquist Sparkman, LLP (57) ABSTRACT

Methods and apparatus are disclosed for performing charged-particle-beam (CPB) microlithography, in which methods and apparatus certain position-measurement marks are detected by appropriate deflections of a charged particle beam. The deflections are performed using a primary deflector and a mark-scanning deflector. For example, the beam is deflected by the primary deflector to illuminate a position-measurement mark on the reticle and a corresponding position-measurement mark on the substrate. The position-measurement mark on the substrate is scanned by minute deflections of the beam as performed by the mark-scanning deflector. Meanwhile, charged particles backscattered from the position-measurement mark on the substrate (as the mark is being scanned) are captured and detected by a detector. The marks are detected at timing moments during normal operation of the primary deflector. Thus, during detection of the marks, the resulting positional determinations are less affected by extraneous variables such as changes in temperature and/or hysteresis of the primary deflector.

26 Claims, 4 Drawing Sheets

MARK-DETECTION METHODS AND CHARGED-PARTICLE-BEAM MICROLITHOGRAPHY METHODS AND APPARATUS COMPRISING SAME

FIELD

This disclosure pertains to microlithography (transfer of a pattern to a sensitive substrate), especially as performed using a charged particle beam. Microlithography is a key technology used in the fabrication of microelectronic devices such as integrated circuits, displays, and micromachines. More specifically, the disclosure pertains to charged-particle-beam (CPB) microlithography methods and apparatus in which certain alignment marks are detected so as to provide improved accuracy of lithographic exposure.

BACKGROUND

Microlithographic pattern transfer using a charged particle beam is regarded as highly accurate and capable of achieving very fine pattern-transfer resolution. However, charged-particle-beam (CPB) microlithography disadvantageously has low "throughput" compared to optical microlithography (performed using deep UV light). ("Throughput" as used herein refers to the number of lithographic substrates, such as semiconductor wafers, that can be processed lithographically per unit time.) Various approaches have been investigated with the object of substantially improving throughput.

For example, several types of partial-pattern single-shot exposure systems (termed "cell projection," "character projection," and "block exposure" systems) have been devised. In each of the partial-pattern single-shot systems, certain circuit sub-patterns that are highly repeated in the layer being formed are repetitively transferred and exposed using an aperture mask on which one or more of the basic sub-patterns have been defined. An example of such a highly repeated sub-pattern is a memory cell dimensions of approximately 5-$\mu$m square on the lithographic substrate ("sensitive substrate"). Unfortunately, with any of these techniques, variable-shaped-beam tracing is required to form on the substrate those portions of the pattern that are relatively non-repetitive. Consequently, overall throughput is too low for practical application for mass-production of wafers.

An attractive solution to the problem of substantially improving the throughput of CPB microlithography is the so-called "one-shot" pattern-transfer approach, in which the entire pattern for a layer in a single die ("chip") or even for multiple dies is exposed in one "shot." Unfortunately, this approach has not been realized from a practical standpoint for two main reasons. The first reason is that reticles suitable for exposing an entire die pattern in one shot are currently impossible to fabricate. The second reason is that CPB optical systems having optical fields sufficiently large for exposing an entire die pattern without significant off-axis aberrations are currently impossible to fabricate. Consequently, whereas the excitement over the potential of this approach remains high, engineering development work has been directed to other, more feasible, approaches.

One approach receiving much current attention involves dividing a reticle, defining a die pattern, into multiple portions usually termed "subfields." Each subfield defines a respective portion of the overall pattern. The subfields are arrayed on the reticle in an ordered manner and are exposed in a sequential manner from the reticle to the substrate. This approach is termed the "divided reticle" method, and apparatus configured for performing this method are termed "divided reticle" projection-microlithography apparatus. By performing exposure subfield-by-subfield, the optical field can be sufficiently small to keep aberrations within specifications. Furthermore, any specific aberrations or other errors (e.g., distortion or errors in focus) that arise while exposing a particular subfield can be corrected, on the fly, in a manner that is most suitable for the particular subfield being exposed. The subfield images are placed contiguously on the substrate so as to form, after all the subfields are exposed, the complete die pattern on the substrate surface. Thus, overall exposure is performed with excellent resolution, accuracy, and precision across an optically much wider range than possible with the one-shot transfer method.

So as to expose various subfields on the reticle and form the respective images at proper locations on the substrate, a deflector is provided in the CPB optical system of the microlithography apparatus. This deflector imparts appropriate lateral deflections of the beam to reach the selected subfields. Conventionally, the deflector is an electromagnetic deflector. Since the subfields (which normally are arranged in a highly ordered array) are exposed sequentially by laterally deflecting the beam as required, the deflector experiences a predetermined, repetitive, energization sequence during exposure of the subfields. But, this ordered scheme of energizing the deflector must be stopped temporarily to allow use of the deflector in detecting alignment marks on the substrate by beam irradiation.

An electromagnetic deflector exhibits certain magnetic hysteresis characteristics that are best controlled when the deflector is being energized in a highly ordered manner. The reproducibility of its deflection characteristics is significantly lowered whenever the deflector is being energized in a non-ordered manner (e.g., for irradiating alignment marks). In addition, whenever the electromagnetic deflector is not being energized, the deflector temperature is reduced. Even a slight temperature reduction normally experienced after a shift from a highly ordered energization sequence (for exposing subfields) to a non-ordered energization (for exposing alignment marks) causes significant changes in the deflection characteristics exhibited by the deflector. These changes in deflection characteristics, in turn, cause corresponding errors in positional measurements performed using the beam, such as errors in detecting the positions of alignment marks relative to the axis of the optical system and/or the axes of the reticle stage and substrate stage. These errors generate subtle shifts in the subfield images as formed on the substrate, which decreases the accuracy of pattern transfer.

SUMMARY

In view of the shortcomings of conventional methods and apparatus as summarized above, the invention provides, inter alia, charged-particle-beam (CPB) microlithography apparatus and methods that achieve more accurate detection of position-measurement marks than conventionally. I.e., detections of such marks are less influenced by temperature changes and hysteresis effects of deflection(s) used for performing such detection, which allows more accurate positional detections than currently achievable by current methods and apparatus.

To such ends and according to a first aspect of the invention, methods are provided, in the context of a CPB microlithography method, for detecting a position of a position-measurement mark situated within a deflection field of a CPB optical system. The CPB microlithography method is performed using a CPB optical system that is configured to projection-transfer respective images of exposure units of a pattern, defined on a divided reticle, to a sensitive substrate. In an embodiment of the subject method a charged particle beam (e.g., an electron beam) is deflected within the deflection field, according to a predetermined exposure sequence. While the charged particle beam is being deflected within the deflection field in a sequential manner, the position-measurement mark is irradiated with the charged particle beam. The position of the mark is detected at a moment in which the charged particle beam deflected according to the exposure sequence encounters the position-measurement mark in the deflection field.

The charged particle beam is deflected within the deflection field using a primary deflector in the CPB optical system. In this instance, the method can further comprise the step of scanning the charged particle beam over the position-measurement mark at the moment in which the charged particle beam encounters the position-measurement mark. Scanning of the charged particle beam over the position-measurement mark can be performed using a mark-scanning deflector separate from the primary deflector. After scanning the position-measurement mark, the mark-scanning deflector is de-activated, and sequential deflection is continued using the primary deflector.

The method can further comprise the step of moving the reticle and substrate as required for placing the position-measurement mark in the deflection field. In this instance at least one of the reticle and substrate can be moved to place the position-measurement mark on an optical axis of the CPB optical system. The position of the position-measurement mark is measured while the position-measurement mark is on the optical axis.

According to another aspect of the invention, methods are provided for detecting a relative position of the reticle and substrate, in the context of a CPB microlithography method. In an embodiment of such a method, respective position-measurement marks of the reticle and substrate are situated, within a deflection field of the CPB optical system, on the reticle and substrate. Using a primary deflector of the CPB optical system, a charged particle beam is deflected within the deflection field, according to a predetermined exposure sequence. While the charged particle beam is being deflected by the primary deflector within the deflection field in a sequential manner, the position-measurement marks are irradiated with the charged particle beam. The relative positions of the marks are detected at a moment in which the charged particle beam deflected by the primary deflector according to the exposure sequence encounters the position-measurement marks in the deflection field.

At the moment in which the charged particle beam encounters the position-measurement marks, a mark-scanning deflector in the CPB optical system can be actuated so as to scan the charged particle beam over the position-measurement mark on the substrate. After scanning the position-measurement marks, the mark-scanning deflector is de-actuated, and sequential deflection of the charged particle beam in the deflection field using the primary deflector is continued.

Desirably, the reticle and substrate are mounted on respective stages, in which instance the reticle stage and substrate stage are moved as required to place the position-measurement marks in the deflection field. The reticle stage and substrate stage can be moved to place the position-measurement marks on an optical axis of the CPB optical system, in which instance the relative positions of the position-measurement marks of the reticle and substrate desirably are measured while the position-measurement marks are on the optical axis.

In the methods summarized above, since mark detection is performed while the deflector is activated normally for exposure purposes, the temperature and hysteresis conditions of the deflector during mark detection can be substantially the same as during exposure. Thus, exposure accuracy and precision are improved. Desirably, the mark-scanning deflector has a relatively small deflection angle, and desirably only is operated at the moment, during normal deflection of the charged particle beam for exposure purposes, when the charged particle beam is to be used for mark detection. Also, the mark-scanning deflector exhibits low hysteresis.

In any of the methods summarized above, for example, if a weak detection signal is obtained, the relative positions of the marks can be detected multiple times to obtain multiple mark-detection signals. The mark-detection signals can be combined to obtain a stronger cumulative signal.

According to another aspect of the invention, CPB microlithography apparatus are provided. An embodiment of such an apparatus comprises a reticle stage, a substrate stage, and a CPB optical system. The reticle stage is configured to hold and move the reticle to place the subfields for illumination according to a predetermined exposure sequence. The substrate stage is configured to hold and move the sensitive substrate for imprinting of images of the illuminated subfields at respective locations on the sensitive substrate. The CPB optical system is situated relative to the reticle stage and has a deflection field. The CPB optical system is configured to direct a charged-particle illumination beam so as to illuminate a subfield on the reticle and to project a resulting charged-particle patterned beam, propagating downstream of the reticle, to form an image of the illuminated subfield on the sensitive substrate. The CPB optical system comprises a primary deflector and a mark-scanning deflector. The primary deflector is configured: (a) to direct the illumination beam so as to illuminate the subfields on the reticle sequentially within a deflection field, (b) to direct, as the subfields on the reticle are being illuminated, the resulting patterned beam so as to form images of the illuminated subfields at respective locations on the sensitive substrate within a corresponding deflection field, and (c) to direct the illumination and patterned beams as required to illuminate the respective position-measurement marks on the reticle and substrate. The mark-scanning deflector is configured to scan the patterned beam, which has passed through the respective position-measurement mark on the reticle, over the position-measurement mark on the sensitive substrate.

The CPB optical system desirably comprises an illumination-optical system situated upstream of the reticle and a projection-optical system situated between the reticle and the substrate. Each of the illumination-optical system and projection-optical system comprises a respective primary deflector. Desirably, each of the primary deflectors is an electromagnetic deflector, and the mark-scanning deflector is an electrostatic deflector or small hollow-core electromagnetic deflector.

The illumination-optical system and projection-optical system have respective deflection fields. The primary deflector of the illumination-optical system is configured to deflect the illumination beam within the deflection field of the illumination-optical system, and the primary deflector of the projection-optical system is configured to deflect the patterned beam within the deflection field of the projection-optical system. The mark-scanning deflector desirably is located in the projection-optical system, wherein the mark-scanning deflector is configured to scan the patterned beam, as the illumination beam is illuminating the position-measurement mark on the reticle, over the respective position-measurement mark on the substrate.

The length of the deflection field of the illumination-optical system corresponds to a length of an electrical stripe of subfields arranged on the reticle. Similarly, the length of the deflection field of the projection-optical system corresponds to a length of an electrical stripe of subfields as projected onto the sensitive substrate.

Typically, the CPB optical system has an optical axis. In such a configuration, the reticle stage can be configured to place the position-measurement mark, on the reticle, on the optical axis as the illumination beam illuminates the position-measurement mark. Similarly, the substrate stage can be configured to place the position-measurement mark, on the substrate, on the optical axis as the patterned beam from the illuminated position-measurement mark on the reticle impinges on the position-measurement mark on the substrate. The mark-scanning deflector can be configured to scan the patterned beam, as the illumination beam is illuminating the position-measurement mark on the reticle, over the respective position-measurement mark on the substrate.

The apparatus can further comprise a detector situated and configured to detect backscattered charged particles from the position-measurement mark on the sensitive substrate.

The foregoing and additional features and advantages of the invention will be more readily apparent from the following detailed description, which proceeds with reference to the accompanying drawings.

DETAILED DESCRIPTION

It will be understood that representative embodiments of the invention as described below are not intended to be limiting in any way. The embodiments are described in the context of using an electron beam as an exemplary charged particle beam. However, it will be understood that the principles as described herein are applicable with equal facility to use of another type of charged particle beam as a lithographic energy beam, such as an ion beam.

Figure 1:
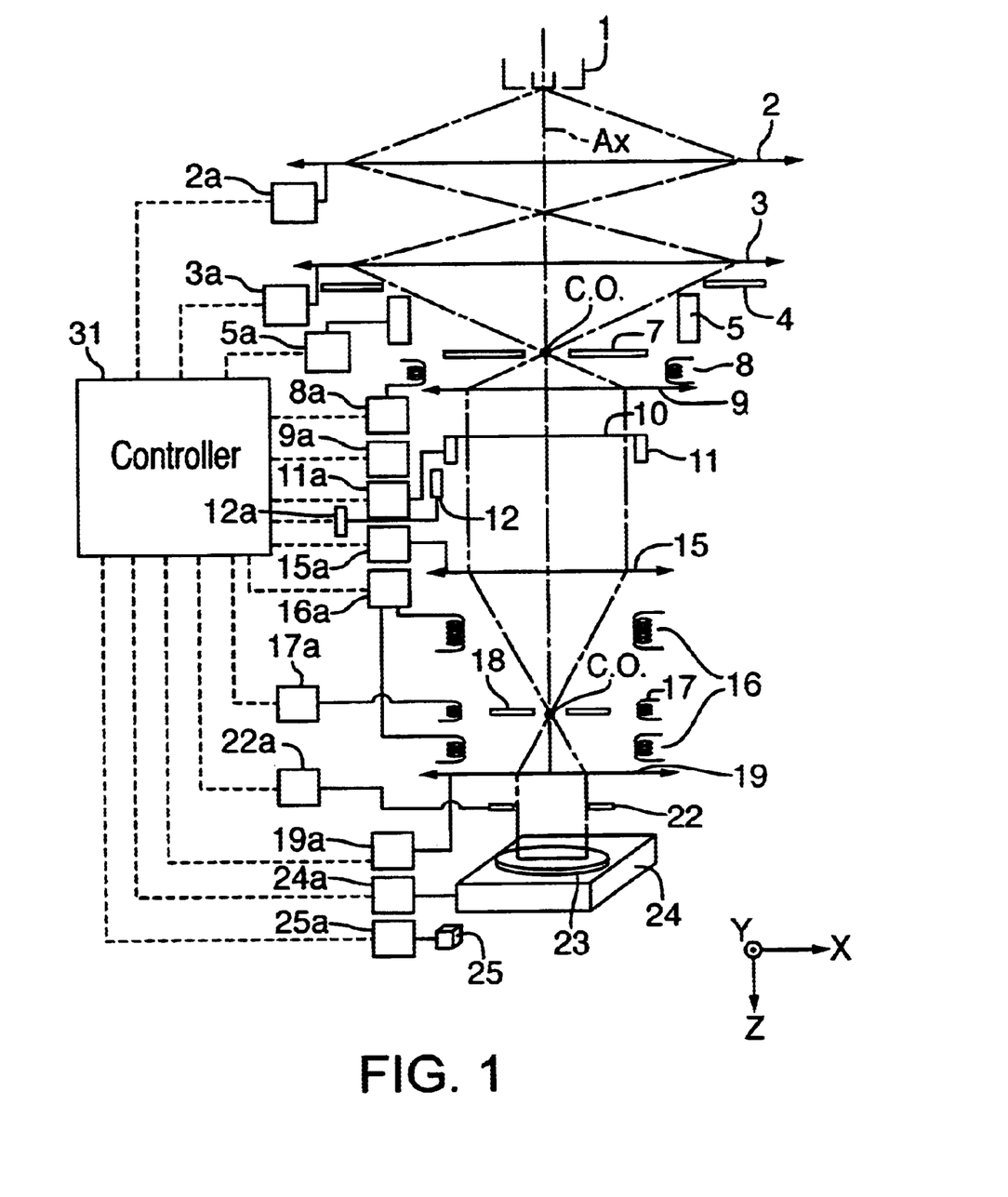
FIG. 1 is an elevational schematic diagram of imaging relationships and control systems of a representative embodiment of a CPB microlithography apparatus employing a segmented reticle, position-measurement marks, primary deflector(s), and mark-scanning deflector as described herein.

First, a general description of an electron-beam projection-exposure (microlithography) apparatus and method, employing a divided reticle, is provided below, referring to FIG. 1. FIG. 1 also depicts general imaging and control relationships of the subject system.

Situated at the extreme upstream end of the system is an electron gun 1 that emits an electron beam propagating in a downstream direction generally along an optical axis Ax. Downstream of the electron gun 1 are a first condenser lens 2 and a second condenser lens 3 collectively constituting a two-stage condenser-lens assembly. The condenser lenses 2, 3 converge the electron beam at a crossover C.O. situated on the optical axis Ax at a blanking diaphragm 7.

Downstream of the second condenser lens 3 is a "beam-shaping diaphragm" 4 comprising a plate defining an axial aperture (typically rectangular or square in profile) that trims and shapes the electron beam passing through the aperture. The aperture is sized and configured to trim the electron beam sufficiently to illuminate one exposure unit (e.g., subfield) on the reticle 10. An image of the beam-shaping diaphragm 4 is formed on the reticle 10 by an illumination lens 9.

The electron-optical components situated between the electron gun 1 and the reticle 10 collectively constitute an "illumination-optical system" of the depicted microlithography system. The electron beam propagating through the illumination-optical system is termed an "illumination beam" because it illuminates a desired region (exposure unit) of the reticle 10. As the illumination beam propagates through the illumination-optical system, the beam actually travels in a downstream direction through an axially aligned "beam tube" (not shown but well understood in the art) that can be evacuated to a desired vacuum level.

A blanking deflector 5 is situated downstream of the beam-shaping aperture 4. The blanking deflector 5 laterally deflects the illumination beam as required to cause the illumination beam to strike the aperture plate of the blanking diaphragm 7, thereby preventing the illumination beam from being incident on the reticle 10 during blanking.

A subfield-selection deflector 8 is situated downstream of the blanking diaphragm 7. The subfield-selection deflector 8 is a "primary deflector" of the illumination-optical system, and is used for laterally deflecting the illumination beam as required to illuminate a desired reticle subfield (or other exposure unit) situated within the optical field of the illumination-optical system. Thus, as described further later below, subfields of the reticle 10 are scanned sequentially by the illumination beam in a horizontal direction (X-direction in the figure). The illumination lens 9 is situated downstream of the subfield-selection deflector 8.

The reticle 10 extends in a plane (X-Y plane) that is perpendicular to the optical axis Ax. The reticle 10 typically defines many exposure units (e.g., thousands of subfields). The exposure units collectively define the pattern for a layer to be formed at a single die ("chip") on a lithographic substrate, wherein each exposure unit defines a respective portion of the pattern. (The exposure units collectively defining an entire pattern can be located on a single reticle or divided between multiple reticles.) One or more position-measurement marks (discussed below in connection with FIG. 2) are defined on the surface of the reticle 10. For example, one X-mark and one Y-mark are disposed at the top of each stripe, and each mark area is of the same size as a subfield.

The reticle 10 is mounted on a movable reticle stage 11. Using the reticle stage 11, by moving the reticle 10 in a direction (Y-direction and/or X-direction) perpendicular to the optical axis Ax, it is possible to illuminate the respective exposure units on the reticle 10 extending over a range that is wider than the optical field of the illumination-optical system. The position of the reticle stage 11 in the X-Y plane is determined using a "position detector" 12 typically configured as a laser interferometer. A laser interferometer is capable of measuring the position of the reticle stage 11 with extremely high accuracy in real time.

Situated downstream of the reticle 10 but upstream of a substrate 23 is the "projection-optical system" portion of the electron-optical system. The projection-optical system comprises first and second projection lenses 15, 19, respectively, an imaging-position deflector 16, a mark-scanning deflector 17, and a contrast-aperture diaphragm 18. The illumination beam, by passage through an illuminated exposure unit of the reticle 10, becomes a "patterned beam" because the beam carries an aerial image of the illuminated exposure unit. The patterned beam is imaged at a specified location on the substrate 23 (e.g., "wafer") by the projection lenses 15, 19 collectively functioning as a "projection-lens assembly," as described further below with reference to FIG. 3.

To ensure imaging at the proper location, the imaging-position deflector 16 imparts the required lateral deflection of the patterned beam. The imaging-position deflector 16 is a "primary deflector" of the projection-optical system, and can deflect the patterned beam laterally over a relatively wide angular range (relative to the axis Ax). The imaging-position deflector 16 typically is configured as an electromagnetic deflector.

In the depicted embodiment, the mark-scanning deflector 17 typically is smaller than the imaging-position deflector 16 and desirably is disposed at the same axial position as the contrast-aperture diaphragm 18. The mark-scanning deflector 17 desirably is configured as an electrostatic deflector (exhibiting a very rapid response) that deflects the patterned beam over a relatively small lateral deflection angle (relative to the axis Ax and compared to the deflector 16). For example, the mark-scanning deflector 17 can be configured as a hollow-core deflector having a small number of coil-winding turns. Desirably, the mark-scanning deflector 17 exhibits extremely low hysteresis. By way of example, the mark-scanning deflector 17 deflects the patterned beam within the range of about ±10 µm on the substrate 23. The mark on the reticle is projected and scanned by the mark-scanning deflector 17.

So as to be imprintable with the image carried by the patterned beam, the upstream-facing surface of the substrate 23 is coated with a suitable "resist" that is imprintably sensitive to exposure by the patterned beam. When forming the image on the substrate 23, the projection-lens assembly "reduces" (demagnifies) the aerial image. Thus, the image as formed on the substrate 23 is smaller (usually by a defined integer-ratio factor termed the "demagnification factor") than the corresponding region illuminated on the reticle 10. By thus causing imprinting on the surface of the substrate 23, the apparatus of FIG. 2 achieves "transfer" of the pattern image from the reticle 10 to the substrate 23.

The substrate 23 is situated on a substrate stage 24 situated downstream of the projection-optical system. As the patterned beam propagates through the projection-optical system, the beam actually travels in a downstream direction through an axially aligned "beam tube" (not shown but well understood in the art) that can be evacuated to a desired vacuum level.

The projection-optical system forms a crossover C.O. of the patterned beam on the optical axis Ax at the rear focal plane of the first projection lens 15. The position of the crossover C.O. on the optical axis Ax is a point at which the axial distance between the reticle 10 and substrate 23 is divided according to the demagnification ratio. Situated at the crossover C.O. (i.e., the rear focal plane) is the contrast-aperture diaphragm 18. The contrast-aperture diaphragm 18 comprises an aperture plate that defines an aperture centered on the axis Ax. With the contrast-aperture diaphragm 18, electrons of the patterned beam that were scattered during transmission through the reticle 10 are blocked so as not to reach the substrate 23.

The substrate 23 is mounted to the substrate stage 24 via a wafer chuck (not shown but well understood in the art), which presents the upstream-facing surface of the substrate 23 in an X-Y plane. The wafer chuck typically is an electrostatic chuck. The substrate stage 24 (with chuck and substrate 23) is movable in the X and Y directions. Thus, by simultaneously scanning the reticle stage 11 and the substrate stage 24 in mutually opposite directions in a synchronous manner, it is possible to transfer each exposure unit within the optical field of the illumination-optical system as well as exposure units located outside the optical field to corresponding regions on the substrate 23. The substrate stage 24 also includes a "position detector" 25 configured similarly to the position detector 12 of the reticle stage 11.

At least one position-measurement mark (discussed below with reference to FIG. 2) is situated at the plane of the upstream-facing surface of the substrate 23, desirably on the upstream-facing surface of the substrate. For example, a position-measurement mark 62 can be located on a scribe line on the substrate 23. The position-measurement mark can be formed by etching mark-element grooves in the surface of the substrate or by forming a patterned layer of a heavy metal (e.g., Ta, W, or the like) that is highly reflective to electrons incident on the substrate 23.

A backscattered-electron (BSE) detector 22 is situated immediately upstream of the substrate 23. The BSE detector 22 is configured to detect and quantify electrons backscattered from the position-measurement mark at the substrate 23. The position-measurement mark on the substrate 23 desirably is scanned by a beam that has passed through the corresponding position-measurement mark 61 on the reticle 10. By detecting backscattered electrons from the position-measurement mark 62 at the substrate 23, it is possible to determine the relative positional relationship of the reticle 10 and the substrate 23.

Each of the lenses 2, 3, 9, 15, 19 and deflectors 5, 8, 16, 17 is controlled by a controller 31 via a respective coil-power controller 2a, 3a, 9a, 15a, 19a and 5a, 8a, 16a, 17a. Similarly, the reticle stage 11 and substrate stage 24 are controlled by the controller 31 via respective stage drivers 11a, 24a. The position detectors 12, 25 produce and route respective stage-position signals to the controller 31 via respective interfaces 12a, 25a and other circuitry for achieving such ends. In addition, the BSE detector 22 produces and routes signals to the controller 31 via a respective interface 22a.

From the respective data routed to the controller 31, as an exposure unit is being transferred the controller 31 ascertains, inter alia, any control errors of the respective stage positions. To correct such control errors, the imaging-position deflector 16 is energized appropriately to deflect the patterned beam. Thus, a reduced image of the illuminated exposure unit on the reticle 10 is transferred accurately to the desired target position on the substrate 23. This real-time correction is made as each respective exposure-unit image is being transferred to the substrate 23, and the exposure-unit images are positioned such that they are stitched together properly on the substrate 23.

Figure 2:
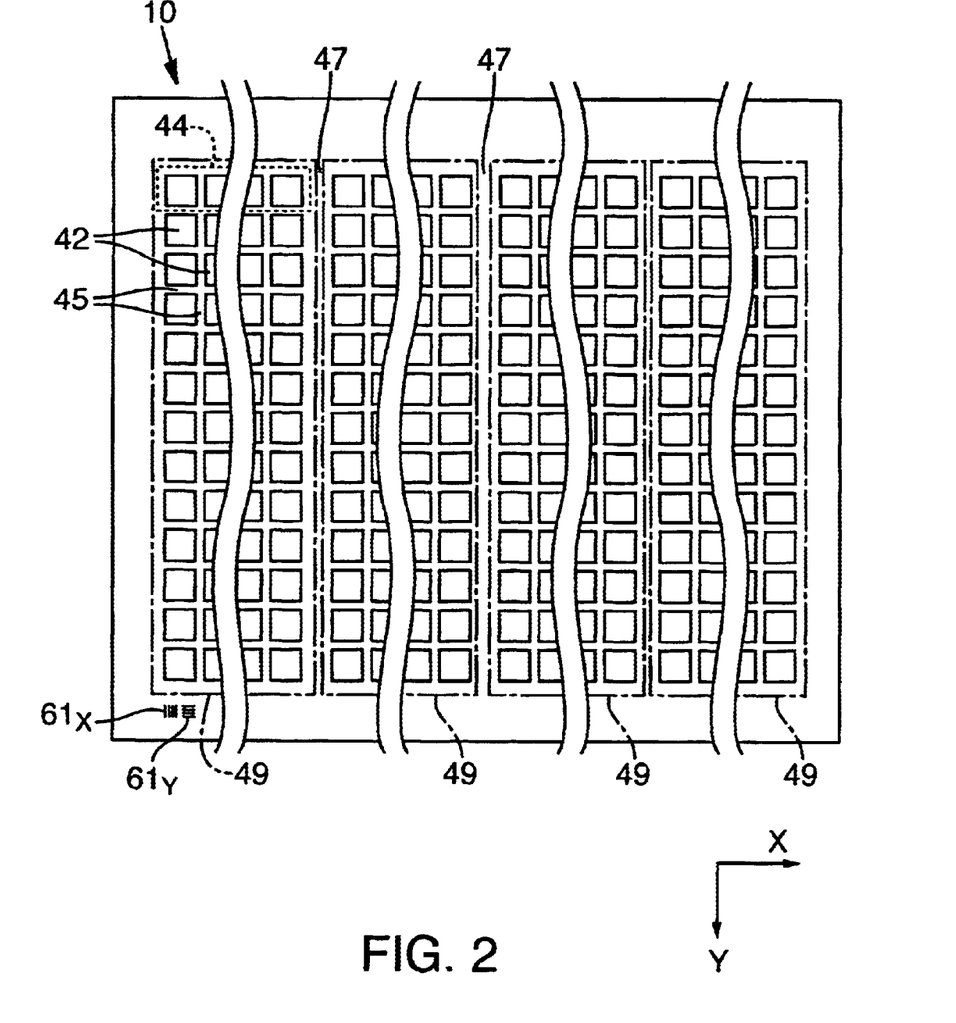
FIG. 2 is a plan view showing general aspects of a segmented reticle as used, for example, in the apparatus of FIG. 1.

FIG. 2 shows in plan view the general configuration of an exemplary "segmented" or "divided" reticle 10 comprising many subfields as representative exposure units. This reticle can be fabricated by, e.g., performing electron-beam drawing of the pattern on a surface of a silicon wafer, followed by etching of the patterned surface. In the figure, multiple regions 49 are shown each including a large respective array of subfields 42. The regions 49 generally are termed "mechanical stripes," and each mechanical stripe 49 extends lengthwise in the Y-direction and widthwise in the X-direction in the figure. The mechanical stripe 49 is so named because exposure of it in the Y-direction is achieved by corresponding mechanical motion of the reticle stage 11. Each mechanical stripe 49 includes multiple rows 44 of subfields 42, wherein each row 44 extends lengthwise in the X-direction in the figure. Each row 44 is termed an "electrical stripe" because the row represents the area swept by the illumination beam as the beam is being deflected laterally by the deflector 8. In other words, the length of each row 44 (equal to the width of each mechanical stripe 49) corresponds to the maximum achievable deflection range achievable by the deflector 8 within the optical field of the illumination-optical system. This deflection range is termed the "deflection field."

Each subfield 42 comprises a respective portion of the reticle membrane that defines a respective portion of the pattern. The membrane portion of a subfield is surrounded by a non-patterned region (not shown) termed a "skirt." Depending somewhat upon the particular type of reticle (scattering-membrane reticle or scattering-stencil reticle), the membrane has a thickness of, e.g., 0.1 μm to several μm. In the depicted configuration, the subfields 42 in each electrical stripe 44 and the electrical stripes 44 in each mechanical stripe 49 are separated from each other by respective "minor struts" 45. The mechanical stripes 49 are separated from each other by major struts 47. The major struts 47 and minor struts 45 collectively constitute a support structure termed "grillage."

The upstream-facing surface of the reticle embodiment shown in FIG. 2 also defines position-measurement marks 61. For example, in the depicted embodiment, position-measurement marks 61 are situated adjacent a lower-left corner of the first mechanical stripe 49.

In an electron-beam microlithography system such as the system discussed above with reference to FIG. 1, the patterned beam is deflected by the imaging-position deflector 16 to expose the subfields 42 in a row (i.e., in an electrical stripe 44) of a mechanical stripe 49 in a sequential manner. Meanwhile, the stages 11, 24 are moved continuously in a scanning manner so as to expose the rows 44 in the Y-direction within the mechanical stripe 49 in a sequential manner.

Figure 3:
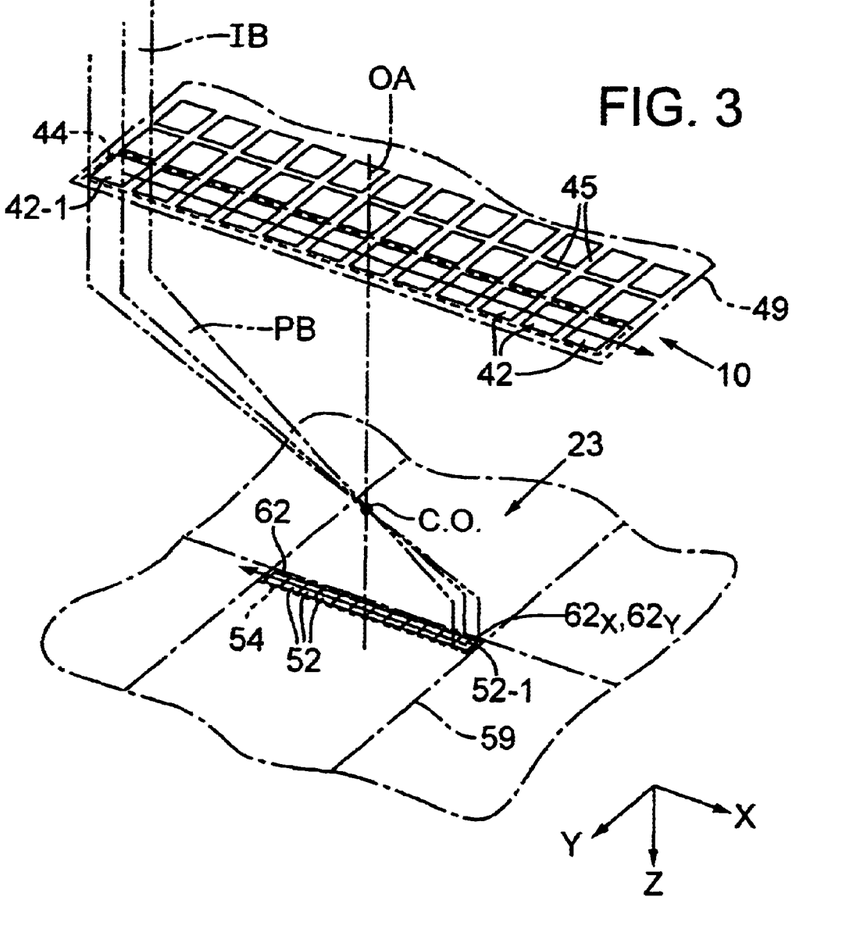
FIG. 3 is a schematic oblique diagram showing certain aspects of pattern transfer from a reticle to a substrate using, for example, the apparatus of FIG. 1.

General aspects of the exposure events summarized above are shown in FIG. 3. Shown at the upper portion of the figure is an end of one mechanical stripe 49 on the reticle 10, wherein the end is shown containing three electrical stripes 44. As described above, each electrical stripe 44 contains multiple constituent subfields 42 separated from each other by intervening minor struts 45. Minor struts 45 also separate individual electrical stripes 44 from each other in the mechanical stripe 49. Downstream of the reticle 10 along the optical axis OA is a corresponding region of the substrate 23 situated in opposition to the reticle. In the figure, the subfield 42-1 in the left corner of the electrical stripe 44 nearest the viewer is being illuminated by the illumination beam IB propagating from upstream. The necessary lateral deflection of the illumination beam IB is imparted by the subfield-selection deflector 8 in the illumination-optical system. The resulting patterned beam PB downstream of the illuminated subfield 42-1 is being exposed (by the projection-optical system, not shown) onto a corresponding region 52-1 in a corresponding electrical stripe 54 on the surface of the substrate 23. As can be seen, the image in the region 52-1 is reduced (demagnified) relative to the corresponding subfield 42-1. The position of the region on the substrate surface at which the image is formed is achieved by appropriate actuation of the imaging-position deflector 16 (FIG. 1).

Between the reticle 10 and the substrate 23, the patterned beam PB is deflected twice by the collective action of the projection lenses 15, 19. The first deflection (performed by the first projection lens 15) is from a direction parallel to the optical axis OA to a direction in which the patterned beam intersects the optical axis OA. The second deflection (performed by the second projection lens 19) is in a direction opposite the first deflection.

The exact position 52 on the surface of the substrate 23 at which a transferred subfield image is formed is established such that the respective subfield images are contiguous with one another with no intervening spaces or the like. The respective positions 52 of the subfield images relative to each other typically correspond to the respective positions of the corresponding subfields 42 on the reticle 10. As noted above, this alignment of individual subfield images on the substrate 23 is achieved by appropriate deflections of the patterned beam by the imaging-position deflector 16 (FIG. 1). The subfield images as formed on the substrate 23 lack intervening grillage and skirts. To eliminate the grillage and skirts, the respective transfer position of each subfield image 52 is shifted appropriately, due to actuation of the imaging-position deflector 16, by an amount that corresponds to the combined widths of the skirt and minor strut 45 associated with the respective subfield 42 on the reticle. Since the subfields 42 on the reticle 10 are arranged in a regular array (which tends to be the same from one reticle to the next), actuation of the imaging-position deflector 16 tends to be of a pre-determined, repetitive, and cyclical nature during exposure.

This positional adjustment of subfield images on the substrate 23 must be performed in both the X-direction and Y-direction, and is achieved by appropriate deflections of the patterned beam PB as mediated by the imaging-position deflector 16. To such end, the deflector 16 actually includes separate respective deflectors for each of the X-direction and Y-direction.

Before exposure of the mechanical stripe 49, the reticle stage 11 is moved as required to place the position-measurement marks $61_X$ (on the reticle 10) on the optical axis OA. Similarly, the substrate stage 24 also is moved to place a corresponding position-measurement mark $62_X$ (on the surface of the substrate 23) on the optical axis OA. As the illumination beam illuminates the position-measurement mark $61_X$, portions of the beam passing through the mark $61_X$ impinge on the mark $62_X$. Thus, the patterned beam from the position-measurement mark $61_X$ is scanned over the position-measurement mark $62_X$ on the substrate during the normal use of the deflectors 8, 16. Also, whenever the beams IB, PB are on the optical axis in the course of being continuously deflected for performing exposure, the mark-scanning deflector 17 (FIG. 1) is actuated as required to deflect and scan the patterned beam PB (produced by passage of the illumination beam IB through the position-measurement mark $61_X$ on the reticle) over the position-measurement mark $62_X$ on the substrate. The BSE detector 22 (FIG. 1) detects charged particles backscattered from the mark $62_X$. The same procedure is applied for the Y-marks $61_Y$, $62_Y$. Thus, the relative positional relationship of the reticle 10 and substrate 23 is determined.

During irradiation of the marks $61_X$, $62_X$ the mark-scanning deflector 17 typically is actuated for only a short time (e.g., 200 μs). As a result of such short irradiation, situations may arise in which an adequate signal level cannot be obtained. In such an instance, a stronger signal can be obtained by repeating the irradiation of the position-measurement marks $61_X$, $62_X$ while actuating the mark-scanning deflector 17, and accumulating the signals.

In the mark-scanning protocol described above, charged particles transmitted by the mark $61_X$ and backscattered from the alignment mark $62_X$ are detected during the course of actuating the primary deflectors 8, 16. During the instances in which the position-measurement marks $61_X$, $62_X$ are being irradiated, the mark-scanning deflector 17 is being actuated to scan the mark $62_X$. Thus, mark detection is performed using the low-hysteresis mark-scanning deflector 17 without having to stop exposure-actuation of the imaging-position deflectors 8, 16. This manner of mark detection allows position detection to be performed more accurately under deflection-actuation conditions that are closer to the actual exposure conditions.

Figure 4:
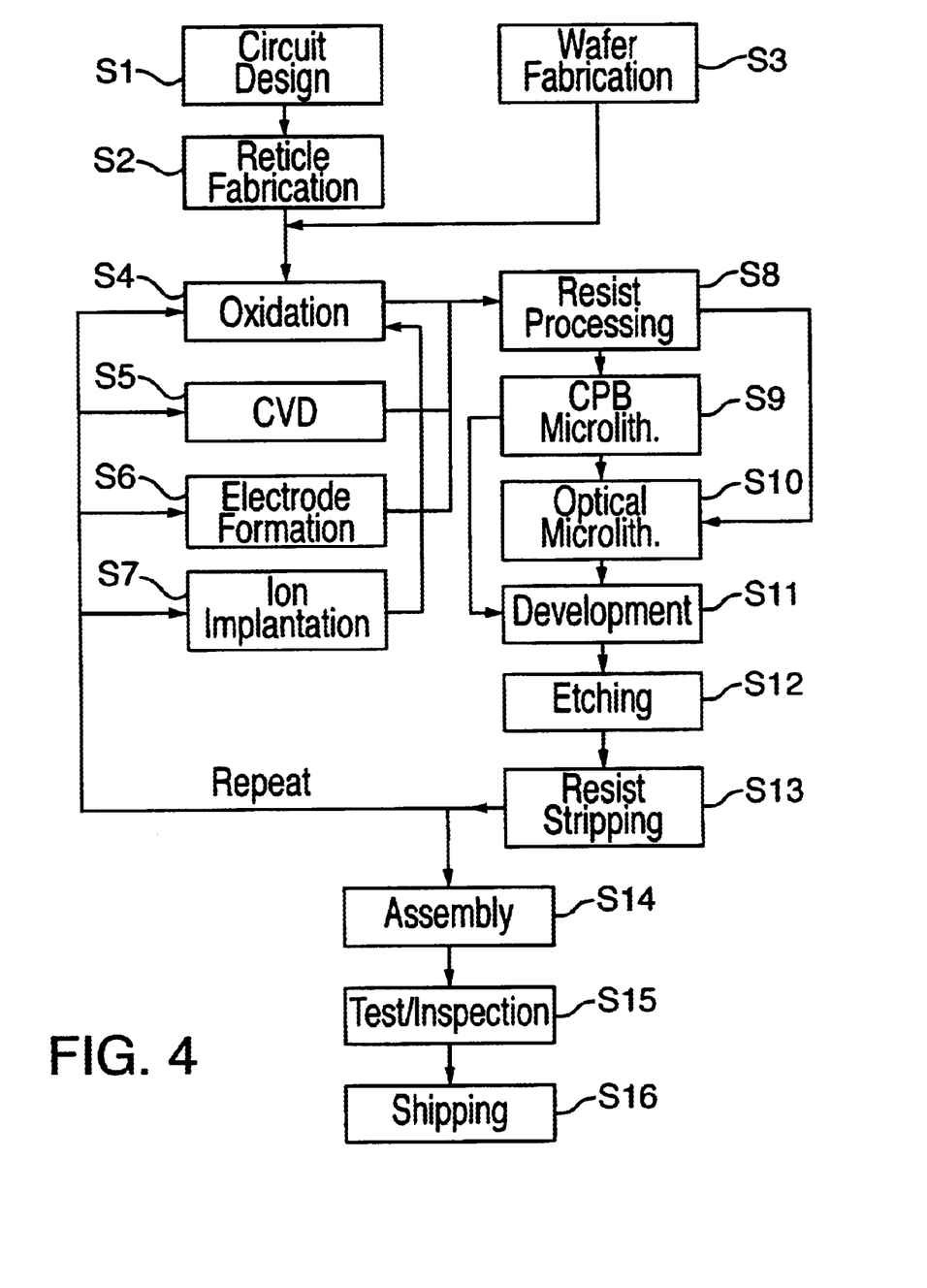
FIG. 4 is a flowchart of steps in a process for manufacturing a microelectronic device such as a semiconductor chip (e.g., integrated circuit or LSI), liquid-crystal panel, CCD, thin-film magnetic head, or micromachine, the process including performing microlithography using a microlithography apparatus as described herein.

FIG. 4 is a flow chart of steps in a process for manufacturing a microelectronic device such as a semiconductor chip (e.g., an integrated circuit or LSI device), a display panel (e.g., liquid-crystal panel), charged-coupled device (CCD), thin-film magnetic head, micromachine, for example. In step S1, the circuit for the device is designed. In step S2 a reticle ("mask") for the circuit is manufactured. In step S2, local resizing of pattern elements can be performed to correct for proximity effects or space-charge effects during exposure. In step S3, a wafer (substrate) is manufactured from a material such as silicon.

Steps S4–S13 are directed to wafer-processing steps (described below), in which the circuit pattern defined on the reticle is transferred onto the wafer by microlithography. Steps S14–S16 are "post-process" steps. Specifically, step S14 is an assembly step in which the wafer that has been passed through steps S4–S13 is formed into semiconductor chips. This step can include, e.g., assembling the devices (dicing and bonding) and packaging (encapsulation of individual chips). Step S15 is an inspection step in which any of various operability, qualification, and durability tests of the device produced in step S14 are conducted. Afterward, devices that successfully pass step S15 are finished, packaged, and shipped (step S16).

Steps S4–S13 provide representative details of wafer processing. Step S4 is an oxidation step for oxidizing the surface of a wafer. Step S5 involves chemical vapor deposition (CVD) for forming an insulating film on the wafer surface. Step S6 is an electrode-forming step for forming electrodes on the wafer (typically by vapor deposition). Step S7 is an ion-implantation step for implanting ions (e.g., dopant ions) into the wafer. Step S8 involves application of a resist (exposure-sensitive material) to the wafer. Step S9 involves microlithographically exposing the resist using a charged particle beam so as to imprint the resist with the reticle pattern of the reticle produced in step S2. In step S9, a CPB microlithography apparatus as described above can be used. Step S10 involves microlithographically exposing the resist using optical microlithography. This step also can be performed using a reticle as produced in step S2. Also, during Step S10, an exposure can be performed (before, during, or after the pattern exposure) in a manner serving to correct proximity effects (e.g., normalizing backscattered electrons of the patterned beam). Step S11 involves developing the exposed resist on the wafer. Step S12 involves etching the wafer to remove material from areas where developed resist is absent. Step S13 involves resist separation (resist "stripping"), in which remaining resist on the wafer is removed after the etching step. By repeating steps S4–S13 as required, circuit patterns as defined by successive reticles are formed superposedly on the wafer.

In the foregoing description, mark detections are performed in the course of continuous "primary" deflection of the beam for exposure. Mark scanning (and hence detection) desirably is performed at an instant in which the beam, as a result of primary deflection, is on the optical axis. Alternatively, mark detection during primary deflection of the beam need not be on-axis; rather, mark detection can be performed at any of various other specified locations relative to the axis.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithography method performed using a CPB optical system configured to projection-transfer respective images of exposure units of a pattern, defined on a divided reticle, to a sensitive substrate, a method for detecting respective positions of position-measurement marks situated within a deflection field of the CPB optical system, the method comprising:

deflecting a charged particle beam within the deflection field to expose the exposure units of the deflection field sequentially, according to a predetermined exposure sequence; and while the charged particle beam is being deflected within the deflection field according to the exposure sequence, deflecting the beam to irradiate the position-measurement marks in the deflection field with the charged particle beam and to detect the positions of the marks according to the same exposure sequence.

2. The method of claim 1, wherein the charged particle beam is deflected within the deflection field using a primary deflector in the CPB optical system.

3. The method of claim 2, further comprising the step of scanning the charged particle beam over the position-measurement mark at the moment in which the charged particle beam encounters the position-measurement mark.

4. The method of claim 3, wherein:

scanning of the charged particle beam over the position-measurement mark is performed using a mark-scanning deflector separate from the primary deflector; and after scanning the position-measurement mark, de-actuating the mark-scanning deflector and continuing sequential deflection using the primary deflector.

5. The method of claim 1, further comprising the step of moving at least one of the reticle and substrate as required to place the position-measurement mark in the deflection field.

6. The method of claim 5, wherein:

at least one of the reticle and substrate is moved to place the position-measurement mark on an optical axis of the CPB optical system; and the position of the position-measurement mark is measured while the position-measurement mark is on the optical axis.

7. In a charged-particle-beam (CPB) microlithography method performed using a CPB optical system configured to projection-transfer respective images of subfields of a divided pattern, defined on a reticle, to a sensitive substrate, a method for detecting a relative position of the reticle and substrate, the method comprising:

situating respective position-measurement marks of the reticle and substrate within a deflection field of the CPB optical system;

using a primary deflector of the CPB optical system, deflecting a charged particle beam within the deflection field to expose the subfields of the deflection field in a sequential manner, according to a predetermined exposure sequence; and as the charged particle beam is being deflected by the primary deflector within the deflection field in a sequential manner, deflecting the beam to irradiate the position-measurement marks in the deflection field with the charged particle beam and to detect the relative positions of the marks according to the same exposure sequence.

8. The method of claim 7, further comprising the steps:

at the moment in which the charged particle beam encounters the position-measurement marks, actuating a mark-scanning deflector in the CPB optical system so as to scan the charged particle beam over the position-measurement mark on the substrate; and after scanning the position-measurement marks, de-actuating the mark-scanning deflector and continuing sequential deflection in the deflection field using the primary deflector.

9. The method of claim 7, further comprising the steps of:

mounting the reticle and substrate on respective stages; and moving the reticle stage and substrate stage as required to place the respective position-measurement marks in the deflection field.

10. The method of claim 9, wherein:

the reticle stage and substrate stage are moved to place the respective position-measurement marks on an optical axis of the CPB optical system; and the relative positions of the position-measurement marks of the reticle and substrate are measured while the position-measurement marks are on the optical axis.

11. The method of claim 7, further comprising the steps of:

detecting the respective positions of the marks multiple times to obtain respective mark-detection signals; and accumulating the mark-detection signals.

12. A charged-particle-beam (CPB) microlithography apparatus for transferring a pattern, defined by a reticle divided into multiple subfields, from the reticle to a sensitive substrate, the apparatus comprising:

a reticle stage configured to hold and move the reticle to place the subfields for illumination according to a predetermined exposure sequence;

a substrate stage configured to hold and move the sensitive substrate for imprinting of images of the illuminated subfields at respective locations on the sensitive substrate;

a CPB optical system situated relative to the reticle stage and having a deflection field, the CPB optical system being configured to direct a charged-particle illumination beam so as to illuminate a subfield on the reticle and to project a resulting charged-particle patterned beam, propagating downstream of the reticle, to form an image of the illuminated subfield on the sensitive substrate, the CPB optical system comprising a primary deflector and a mark-scanning deflector;

the primary deflector being configured (a) to direct the illumination beam so as to illuminate the subfields on the reticle sequentially within a deflection field, (b) to direct, as the subfields on the reticle are being illuminated sequentially, the resulting patterned beam so as to form images of the illuminated subfields at respective locations on the sensitive substrate within a corresponding deflection field, and (c) to direct the illumination and patterned beams as required to illuminate the respective position-measurement marks on the reticle and substrate; and the mark-scanning deflector being configured to scan the patterned beam, which has passed through the respective position-measurement mark on the reticle, over the position-measurement mark on the sensitive substrate.

13. The apparatus of claim 12, wherein:

the CPB optical system comprises an illumination-optical system situated upstream of the reticle and a projection-optical system situated between the reticle and the substrate; and each of the illumination-optical system and projection-optical system comprises a respective primary deflector.

14. The apparatus of claim 13, wherein:

each of the primary deflectors is an electromagnetic deflector; and the mark-scanning deflector is an electrostatic deflector.

15. The apparatus of claim 13, wherein:

the illumination-optical system has a respective deflection field;

the projection-optical system has a respective deflection field;

the primary deflector of the illumination-optical system is configured to deflect the illumination beam within the deflection field of the illumination-optical system; and the primary deflector of the projection-optical system is configured to deflect the patterned beam within the deflection field of the projection-optical system.

16. The apparatus of claim 13, wherein:

the mark-scanning deflector is located in the projection-optical system; and the mark-scanning deflector is configured to scan the patterned beam, as the illumination beam is illuminating the position-measurement mark on the reticle, over the respective position-measurement mark on the substrate.

17. The apparatus of claim 13, wherein:

the deflection field of the illumination-optical system corresponds to a length of an electrical stripe of subfields arranged on the reticle; and the deflection field of the projection-optical system corresponds to a length of an electrical stripe of subfields as projected onto the sensitive substrate.

18. The apparatus of claim 12, wherein:

the CPB optical system has an optical axis;

the reticle stage is configured to place the position-measurement mark, on the reticle, on the optical axis as the illumination beam illuminates the position-measurement mark;

the substrate stage is configured to place the position-measurement mark, on the substrate, on the optical axis as the patterned beam from the illuminated position-measurement mark on the reticle impinges on the position-measurement mark on the substrate; and the mark-scanning deflector is configured to scan the patterned beam, as the illumination beam is illuminating the position-measurement mark on the reticle, over the respective position-measurement mark on the substrate.

19. The apparatus of claim 12, further comprising a detector situated and configured to detect backscattered charged particles from the position-measurement mark on the sensitive substrate.

20. A method for performing charged-particle-beam (CPB) microlithography, comprising the detection method as recited in claim 1.

21. A method for performing charged-particle-beam (CPB) microlithography, comprising the detection method as recited in claim 7.

22. A method for fabricating a microelectronic device, the method comprising a CPB microlithography method as recited in claim 20.

23. A method for fabricating a microelectronic device, the method comprising a CPB microlithography method as recited in claim 20.

24. A method for fabricating a microelectronic device, the method comprising a microlithography step performed using a CPB microlithography apparatus as recited in claim 12.

25. The method of claim 1, wherein the positions of the position-measurement marks are detected at respective moments at which the charged particle beam encounters the respective position-measurement marks in the deflection field.

26. The method of claim 7, wherein the respective positions of the position-measurement marks are detected at a moment in which the charged particle beam deflected by the primary deflector according to the exposure sequence encounters the position-measurement marks in the deflection field.

\* \* \* \* \*

UNITED STATES PATENT AND TRADEMARK OFFICE
CERTIFICATE OF CORRECTION

PATENT NO. : 6,680,481 B2
DATED : January 20, 2004
INVENTOR(S) : Okino

It is certified that error appears in the above-identified patent and that said Letters Patent is hereby corrected as shown below:

Column 1,
Line 39, "cell dimensions" should read -- cell having dimensions --.

Column 16,
Line 6, "claim 20" should read -- claim 21 --.

Signed and Sealed this

Third Day of May, 2005

JON W. DUDAS
*Director of the United States Patent and Trademark Office*